United States Patent
Chen et al.

(10) Patent No.: US 12,176,430 B2
(45) Date of Patent: Dec. 24, 2024

(54) SEMICONDUCTOR STRUCTURE AND SEMICONDUCTOR DEVICE

(71) Applicant: Vanguard International Semiconductor Corporation, Hsinchu (TW)

(72) Inventors: Chih-Yen Chen, Tainan (TW); Franky Juanda Lumbantoruan, Sumatera Utara (ID)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 193 days.

(21) Appl. No.: 16/938,560

(22) Filed: Jul. 24, 2020

(65) Prior Publication Data
US 2022/0029007 A1    Jan. 27, 2022

(51) Int. Cl.
| | |
|---|---|
| *H01L 29/778* | (2006.01) |
| *H01L 29/06* | (2006.01) |
| *H01L 29/15* | (2006.01) |
| *H01L 29/20* | (2006.01) |
| *H01L 29/205* | (2006.01) |

(52) U.S. Cl.
CPC ...... *H01L 29/7785* (2013.01); *H01L 29/0638* (2013.01); *H01L 29/155* (2013.01); *H01L 29/2003* (2013.01); *H01L 29/205* (2013.01)

(58) Field of Classification Search
CPC ............ H01L 29/7785; H01L 29/0638; H01L 29/155; H01L 29/2003; H01L 29/205
See application file for complete search history.

(56) References Cited

U.S. PATENT DOCUMENTS

| | | | |
|---|---|---|---|
| 8,212,288 B2 * | 7/2012 | Komiyama | H01L 21/0254 257/190 |
| 8,410,472 B2 * | 4/2013 | Ikuta | H01L 29/1075 257/15 |
| 9,306,009 B2 * | 4/2016 | Hallin | H01L 21/0242 |
| 9,502,525 B2 * | 11/2016 | Ishiguro | H01L 21/0251 |
| 9,768,258 B1 * | 9/2017 | Prechtl | H01L 21/02507 |
| 9,831,310 B2 * | 11/2017 | Kotani | H02M 3/335 |
| 10,347,738 B1 * | 7/2019 | Ramu | H01L 21/764 |
| 10,410,859 B2 * | 9/2019 | Ichimura | H01L 29/812 |

(Continued)

FOREIGN PATENT DOCUMENTS

| | | |
|---|---|---|
| TW | 201839980 A | 11/2018 |
| TW | 201906169 A | 2/2019 |
| TW | 201916367 A | 4/2019 |

OTHER PUBLICATIONS

Murugapandiyan et al., "DC and microwave characteristics of AlN spacer based Al0.37Ga0.63N/GaN HEMT on SiC substrates for high power RF applications," International Journal of Nanoelectronics and Materials 10 (2017) pp. 111-122.*

(Continued)

*Primary Examiner* — Jay C Kim
(74) *Attorney, Agent, or Firm* — Birch, Stewart, Kolasch & Birch, LLP (57) ABSTRACT

A semiconductor structure and a semiconductor device are provided. The semiconductor includes a substrate, a seed layer on the substrate, a buffer layer on the seed layer, a back barrier layer with a V-group element polarity on the buffer layer, a channel layer on the back barrier layer, and a front barrier layer on the channel layer.

12 Claims, 9 Drawing Sheets

(56) References Cited

U.S. PATENT DOCUMENTS

| | | | |
|---|---|---|---|
| 10,411,125 B2* | 9/2019 | Teo | H01L 29/7786 |
| 10,475,913 B2* | 11/2019 | Huang | H01L 29/778 |
| 10,529,842 B2* | 1/2020 | Shikauchi | H01L 21/0254 |
| 10,566,449 B2* | 2/2020 | Bayruns | H01L 29/66431 |
| 10,651,306 B2* | 5/2020 | Chu | H01L 29/66462 |
| 10,763,332 B2* | 9/2020 | Yamada | H01L 23/562 |
| 10,992,269 B2* | 4/2021 | Ishiguro | H01L 21/02505 |
| 11,024,730 B2* | 6/2021 | Makiyama | H01L 29/66462 |
| 11,201,217 B2* | 12/2021 | Eriguchi | H01L 21/02433 |
| 2002/0036287 A1 | 3/2002 | Yu et al. | |
| 2008/0258135 A1* | 10/2008 | Hoke | H01L 29/201 257/E29.069 |
| 2009/0218599 A1* | 9/2009 | Mishra | H01L 29/66462 257/E29.246 |
| 2013/0075786 A1* | 3/2013 | Ishiguro | H01L 21/02458 257/E29.246 |
| 2014/0266324 A1* | 9/2014 | Teo | H01L 29/7783 327/109 |
| 2017/0104076 A1* | 4/2017 | Prechtl | H01L 29/42316 |
| 2017/0133239 A1* | 5/2017 | Gu | H01L 23/3732 |
| 2017/0170283 A1* | 6/2017 | Laboutin | H01L 29/66431 |
| 2018/0158909 A1 | 6/2018 | Mishra et al. | |
| 2019/0067464 A1* | 2/2019 | Chu | H01L 29/205 |
| 2019/0103482 A1* | 4/2019 | Yang | H01L 29/7783 |
| 2019/0334023 A1* | 10/2019 | Nakata | H01L 29/2003 |
| 2021/0210602 A1* | 7/2021 | Meguro | H01L 21/02458 |

OTHER PUBLICATIONS

Murugapandiyan et al., "Design and Analysis of 20 nm T-Gate AlN/GaN HEMT with InGaN back-barrier for High power Microwave Applications," International Conference on Sustainable Growth through Universal Practices in Science, Technology and Management (ICSGUPSTM-2018), Goa, Jun. 8-10, 2018.*

Taiwanese Office Action and Search Report for Taiwanese Application No. 109112754, dated Jan. 7, 2021.

* cited by examiner

SEMICONDUCTOR STRUCTURE AND SEMICONDUCTOR DEVICE

BACKGROUND

Technical Field

The disclosure is related to a semiconductor structure, and more particularly to a semiconductor structure with a back barrier.

Description of the Related Art

Gallium nitride-based (GaN-based) semiconductor materials have many excellent characteristics, such as high thermal resistance, a wide band-gap, and a high electron saturation rate. Therefore, GaN-based semiconductor materials are suitable for use in high-speed and high-temperature operating environments. In recent years, GaN-based semiconductor materials have been widely used in light-emitting diode (LED) devices and high-frequency devices, such as high electron mobility transistors (HEMT) with heterogeneous interfacial structures.

Even though current semiconductor structures of high electron mobility transistors may be adequate for their intended purposes, they have not been entirely satisfactory in every aspect. For example, the surface polarization is easily occurred in the current structure during the operation of the device, and then the surface channel is formed. Thus, the current collapse is likely to happen and the operation of the device is easily affected. Therefore, the industry still aims at improving performance and the reliability of the high electron mobility transistor devices goals.

SUMMARY

Some embodiments of the present disclosure provide a semiconductor structure. The semiconductor structure includes a substrate, a seed layer on the substrate, a buffer layer on the seed layer, a back barrier layer on the buffer layer, a channel layer on the back barrier layer and a front barrier layer on the channel layer. The back barrier layer has a V-group element polarity.

Some embodiments of the present disclosure provide a device. The device includes a semiconductor structure mentioned above, a gate electrode on the semiconductor structure, a source electrode and a drain electrode on opposite sides of the gate electrode.

A detailed description is given in the following embodiments with reference to the accompanying drawings.

BRIEF DESCRIPTION OF THE DRAWINGS

Aspects of this disclosure are best understood from the following detailed description when read with the accompanying figures. It should be noted that, in accordance with common practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter provided. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "front", "back", "over", "below," "lower," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented and the spatially relative descriptors used herein may likewise be interpreted accordingly.

The terms "about", "approximately", and "substantially" used herein generally refer to the value of an error or a range within 20 percent, preferably within 10 percent, and more preferably within 5 percent, within 3 percent, within 2 percent, within 1 percent, or within 0.5 percent. If there is no specific description, the values mentioned are to be regarded as an approximation that is an error or range expressed as "about", "approximate", or "substantially".

Although some embodiments are discussed with steps performed in a particular order, these steps may be performed in another logical order. Additional features can be provided to the semiconductor structures in embodiments of the present disclosure. Some of the features described below can be replaced or eliminated for different embodiments.

The semiconductor structure with the back barrier layer provided by the present disclosure may prevent surface polarization effect and current collapse from occurred. In addition, sandwiching the channel layer with two barrier layers having the polarity, two potential wells and two conductive channels are formed at the channel layer near the two barrier layers. Thus, the carriers may be controlled and confined in the two conductive channel, thereby improving stability and reliability of the semiconductor device.

Figure 1:
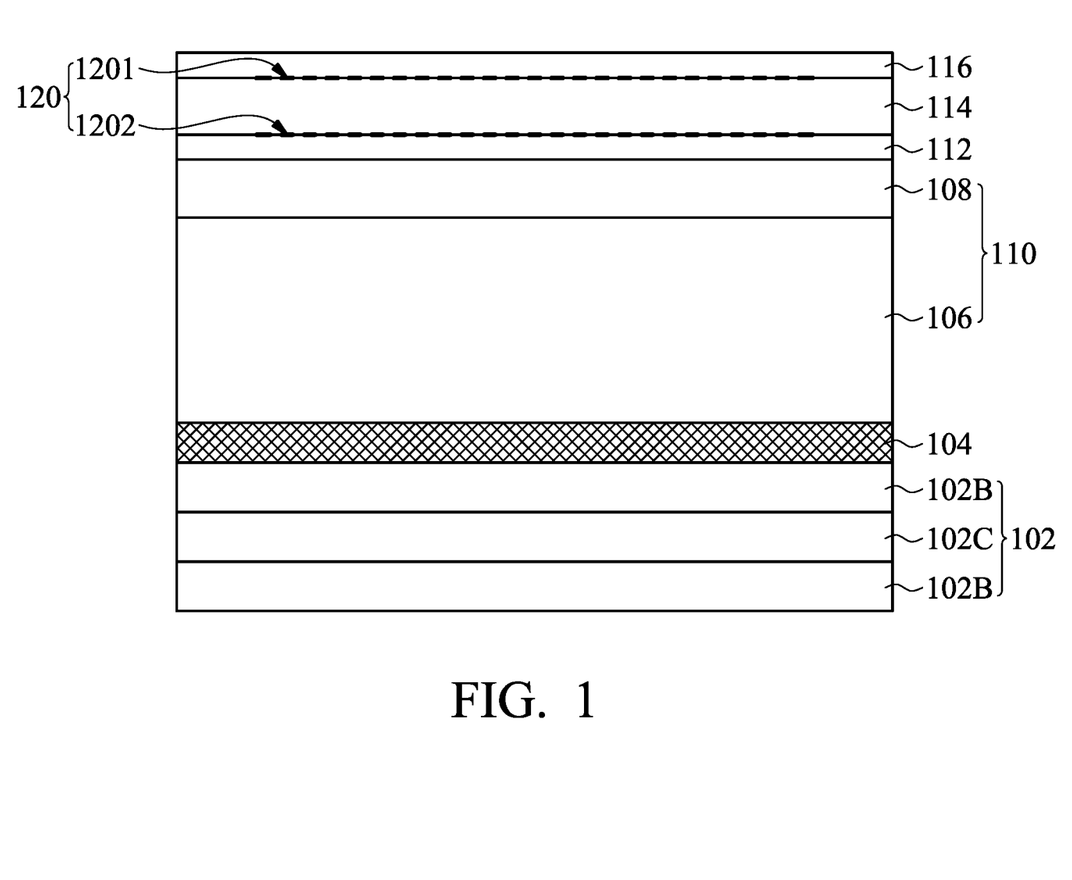
FIG. 1 is a cross-sectional view illustrating an exemplary semiconductor structure according to some embodiments of the present disclosure.

First referring to FIG. 1, FIG. 1 is a cross-sectional view illustrating an exemplary semiconductor structure according to some embodiments of the present disclosure. In some embodiments, the semiconductor structure includes a substrate 102. The substrate 102 may include a ceramic base substrate 102C and a pair of blocking layers 102B sandwiching the ceramic base substrate 102C. Alternatively, the substrate 102 may be silicon on insulator (SOI).

In some embodiments, the ceramic base substrate 102C includes a ceramic material. The ceramic material includes a metal inorganic material. In some embodiments, the ceramic base substrate 102C may include silicon carbide (SiC), aluminum nitride (AlN), sapphire, or another suitable material. The aforementioned sapphire base may include aluminum oxide.

In some embodiments, the blocking layers 102B on the upper and lower surface of the ceramic base substrate 102C may include one or more layers of insulating material and/or another suitable material (such as a semiconductor layer). The insulating material layer may include an oxide, a nitride, an oxynitride, or another suitable material.

The semiconductor layer may include polycrystalline silicon. The blocking layers 102B may prevent the ceramic base substrate 102C from diffusion and may block the ceramic base substrate 102C from interaction with other layers or process tools. In some embodiments, the blocking layer 102B encapsulates the ceramic base material 102C (not shown). In such case, the blocking layers 102B not only cover the upper and lower surface of the ceramic base substrate 102C, but also cover side surfaces of the ceramic base substrate 102C.

Next, still referring to FIG. 1, a seed layer 104 is formed on the substrate 102. In some embodiments, the seed layer 104 is made of silicon (Si), aluminum nitride (AlN) or another suitable material. In some embodiments, the seed layer 104 may include one or more layers of the suitable material layers. For example, the seed layer 104 may include an aluminum nitride (AlN) layer grown at low temperature and another aluminum nitride (AlN) layer grown at high temperature. In some embodiments, the thickness of the aluminum nitride (AlN) layer grown at low temperature is about 0.5~2 nm and the thickness of the aluminum nitride (AlN) layer then grown at high temperature is about 100~300 nm. In the related figures of this example, only the single layer of the seed layer 104 is illustrated in order to clearly describe other features of the semiconductor structure.

In some embodiments, the methods for forming the seed layer 104 include a selective epitaxial growth (SEG) process, a chemical vapor deposition (CVD) process, a molecular beam epitaxy (MBE) process, deposition of doped amorphous semiconductor (e.g., Si) followed by a solid-phase epitaxial recrystallization (SPER) step, methods of directly attaching seed crystals, or another suitable process. The CVD process may include a vapor-phase epitaxy (VPE) process, a low pressure CVD (LPCVD) process, an ultra-high vacuum CVD (UHV-CVD) process, or another suitable process.

Next, still referring to FIG. 1, a buffer layer 110 is formed on the seed layer 104. In some embodiments, the buffer layer 110 includes a superlattice layer 106 and a resistive layer 108 on the superlattice layer 106.

In some embodiments, the superlattice layer 106 may provide strain mitigation and significantly decrease the warpage of the wafer.

In some embodiments, the superlattice layer 106 may be formed by stack of repeating units made of two kinds of III-V group compound. For example, the repeating unit may be formed by a binary compound and a ternary compound.

In some embodiments, the superlattice layer 106 may be a material layer including only one repeating unit. Specifically, the repeating unit may be formed by aluminum nitride (AlN) and aluminium gallium nitride (AlGaN). In some embodiments, the superlattice layer 106 may also be a material layer including multiple repeating units. For example, one of the repeating units may be formed by aluminum nitride (AlN) and aluminium gallium nitride ($Al_xGa_{1-x}N$), and another one of the repeating units may be formed by aluminum nitride (AlN) and aluminium gallium nitride ($Al_yGa_{1-y}N$), wherein x and y are different. In some embodiments, the repeating unit in the superlattice layer 106 remote from the substrate 102 has higher aluminum mole fraction while the repeating unit in the superlattice layer 106 close to the substrate 102 has lower aluminum mole fraction. In some embodiments, the total thickness of the repeating units in the superlattice layer 106 remote from the substrate 102 is about 1~5 μm while the total thickness of the repeating units in the superlattice layer 106 close to the substrate 102 is about 0.4~1.5 μm. In the illustrated figures, only a single layer of the superlattice layer 106 is shown to represent the repeating units for brevity.

In some embodiments, the formation of the superlattice layer 106 may include hydride vapor phase epitaxy (HVPE), molecular beam epitaxy (MBE), metal organic chemical vapor deposition (MOCVD), a combination thereof, or the like.

In some embodiments, the superlattice layer 106 may further have dopants, which facilitate forming electron holes and increasing resistance, and thus avoid leakage current. The dopants may be p-type dopants, such as carbon (C) or iron (Fe).

In some embodiments, the resistive layer 108 may serve as an electrical resistive layer and thus leakage current of device may be reduced. In some embodiments, the resistive layer 108 may be a III-V group compound. In some embodiments, the resistive layer 108 may be a binary or a ternary III-V group compound, such as gallium nitride (GaN).

In some embodiments, the band gap of the resistive layer 108 is lower than the band gap of the back barrier layer 112 on the resistive layer 108, thereby improving the epitaxial quality of the resistive layer and reducing the epitaxial defects so as to inhibit the leakage current. For example, the resistive layer 108 is a III-V group compound free of aluminum (Al) while the back barrier 112 is a III-V group compound including aluminum (Al). Alternatively, the resistive layer 108 and the back barrier 112 may both be III-V group compounds including aluminum (Al), but the resistive layer 108 has the lower aluminum mole fraction. In such case, the back barrier layer 112 is $Al_{z1}Ga_{1-z1}N$ and the resistive layer 108 is $Al_{z2}Ga_{1-z2}N$, wherein z1>z2, taken as an example. The details of the back barrier layer 112 will be described in the following.

In some embodiments, the thickness of the resistive layer is about 0.5-5 μm.

In some embodiments, the formation of the resistive layer 106 may include hydride vapor phase epitaxy (HVPE), molecular beam epitaxy (MBE), metal organic chemical vapor deposition (MOCVD), a combination thereof, or the like.

In some embodiments, the resistive layer 108 may further have dopants, which prevents the carriers in the conductive channel 120 from being trapped by the resistive layer 108. The dopants may be p-type dopants, such as carbon (C) or iron (Fe). The concentration of the dopants may be about $1 \times 10^{19}$ $cm^{-3}$-$5 \times 10^{20}$ $cm^{-3}$.

Next, still referring to FIG. 1, a back barrier layer 112, a channel layer 114 and a front barrier layer 116 are formed in sequence.

In some embodiments, the back barrier layer 112 may have a III-group element polarity or a V-group element polarity. In some embodiments, the front barrier layer 116 may have a III-group element polarity.

In some embodiments, the V-group elements include non-metallic elements, such as nitrogen (N), phosphorus (P), arsenic (As), and so on, and the V-group element polarity includes an non-metallic element polarity, such as a nitrogen polarity (also referred to as N-polar), a phosphorus polarity (also referred to as P-polar), and an arsenic polarity (also referred to as As-polar).

In some embodiments, the III-group elements include metallic elements, such as aluminum (Al), gallium (Ga), indium (In), thallium (Tl), and so on, and the III-group element polarity includes a metallic element polarity, such as an aluminum polarity (also referred to as Al-polar), a gallium polarity (also referred to as Ga-polar), an indium polarity (also referred to as In-polar), and a thallium polarity (also referred to as Tl-polar).

Figure 2:
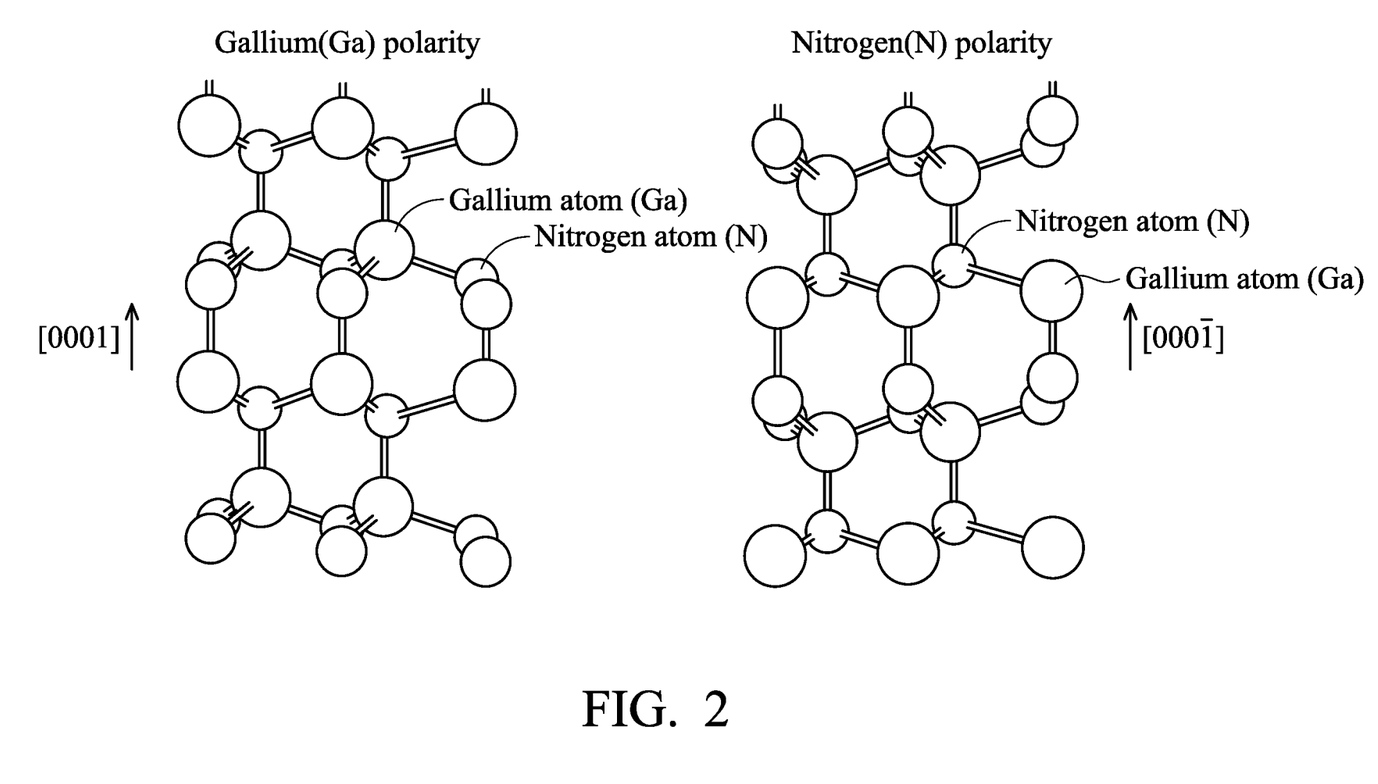
FIG. 2 is a schematic view illustrating lattice arrangements of a nitrogen (N) polarity of gallium nitride (GaN) and a gallium (Ga) polarity of gallium nitride (GaN) according to some embodiments of the present disclosure.

Generally, the III-V group compound may have the III-group element polarity or the V-group element polarity. Referring to FIG. 2, FIG. 2 is a schematic view illustrating lattice arrangement of a nitrogen (N) polarity and a gallium (Ga) polarity of gallium nitride (GaN) taken as an example according to other embodiments of the present disclosure. The electronegativity of the nitrogen atom (N) and that of the gallium atom (Ga) are greatly different. Additionally, gallium nitride (GaN) is hexagonal close-packed (HCP), so that the bond between the nitrogen atom (N) and the gallium atom (Ga) has a dipole moment, and thus the build-in polarization field is formed. Therefore, the III-V group compound with the polarity may tilt its potential energy, and thus the formation position of the carriers may be controlled easily.

In the art, the polarity of gallium nitride (GaN) grown along the direction [0001] is generally called a gallium face (Ga-face) or a gallium (Ga) polarity, as shown in the left side of FIG. 2. The polarity of gallium nitride (GaN) grown along the direction [0001] is called a nitrogen face (N-face) or a nitrogen (N) polarity, as shown in the right side of FIG. 2.

Simply speaking, the difference between the gallium (Ga) polarity and the nitrogen (N) polarity is derived from different lattice arrangement due to different manners of formation, and as a result, opposite polarities will be formed.

In some embodiments, the III-V group compound with the nitrogen (N) polarity and the gallium (Ga) polarity may be formed by plasma induced molecular beam epitaxy (PIMBE) or metalorganic chemical vapor deposition (MOCVD).

It should be noted that the film (such as resistive layer 108) under the back barrier layer 112 may also have the polarity, such as the III-group element polarity, and may be adjusted by actual requirements.

Figure 3:
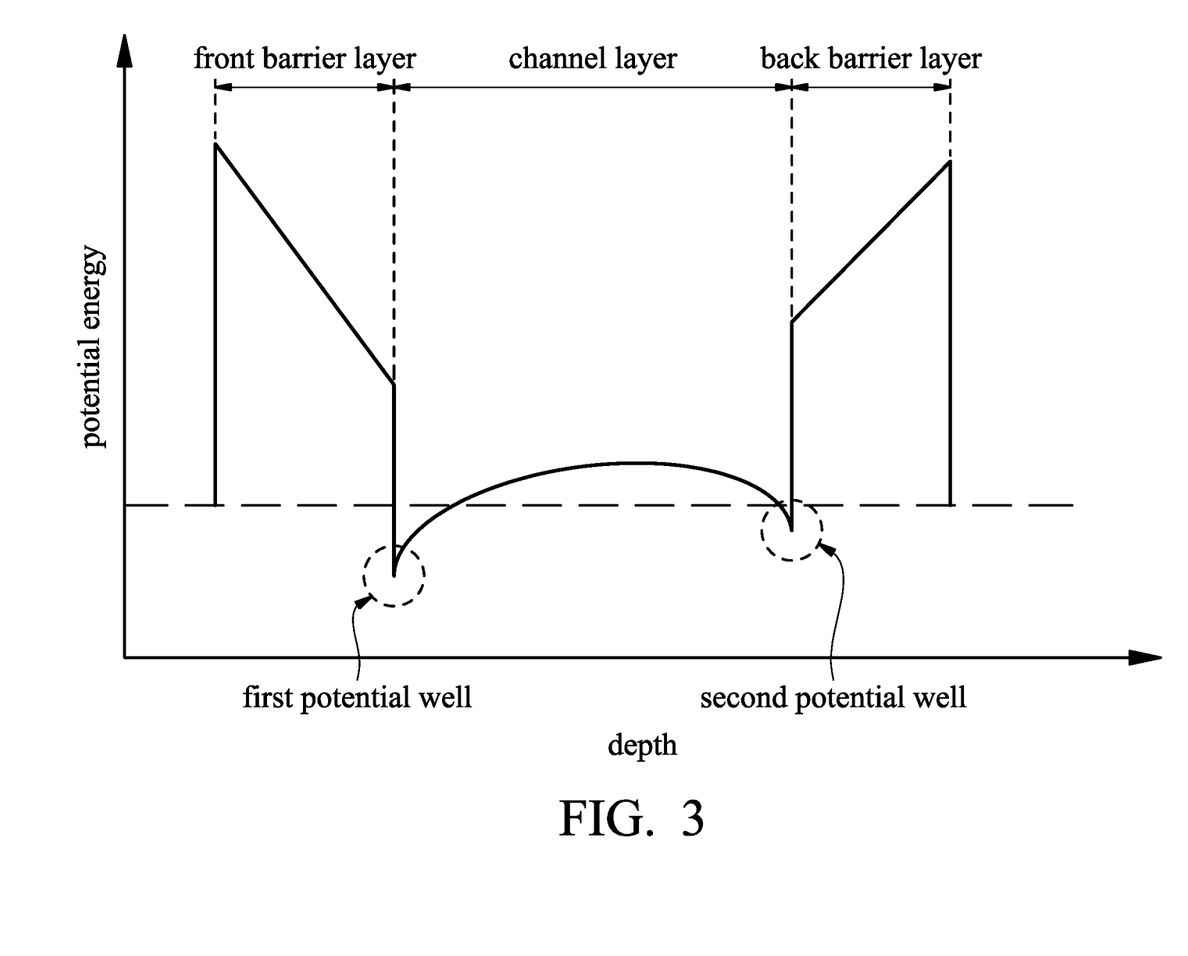
FIG. 3 is a plot of potential energy of the back barrier layer, the channel layer, and the front barrier layer versus depth profiles according to the embodiment of FIG. 1 in the present disclosure.

Next, referring to FIG. 3, FIG. 3 is a schematic view illustrating potential energy of a back barrier, a channel barrier, and a front barrier changes with depth according to the embodiment of FIG. 1 in the present disclosure.

The channel layer 114 and the barrier layers (such as the front barrier layer 116 and the back barrier layer 112) include different materials, so that the channel layer 114 and the barrier layers (such as the front barrier layer 116 and the back barrier layer 112) have different band gap of the materials. Thus, the conductive bands are bent at the interface of the channel layer 114 and the barrier layers (such as the front barrier layer 116 and the back barrier layer 112), and thus the potential wells are formed at the junction interfaces.

Due to the lower potential energy of the potential well, the carriers ionized in the channel layer 114 tend to gather at the potential well to form the conductive channel 120, such as two-dimensional electron gas (2DEG).

Referring FIG. 1 and FIG. 3, in some embodiments, the front barrier layer 116, the channel layer 114 and the back barrier 112 are configured to form a first potential well and a second potential well. Specifically, the first potential well is positioned at the interface of the channel layer 114 and the front barrier layer 116, and the second potential well is positioned at the interface of the channel layer 114 and the back barrier layer 112.

Still referring FIG. 1 and FIG. 3, in some embodiments, the conductive channel 120 is disposed at the potential well. Specifically, the first conductive channel 1201 and the second conductive channel 1202 are located at the interface of the channel layer 114 and the front barrier layer 116 and located at the interface of the channel layer 114 and the back barrier layer 112, respectively. In other words, the position of the conductive channels and the position of the potential wells are substantially overlapped. Thus, the first potential well may correspond to the first conductive channel 1201 and the second potential well may correspond to the second conductive channel 1202.

In the embodiments of FIG. 3, the potential energy of the back barrier layer 112 with the V-group element polarity and that of the front barrier layer 116 with the III-group element polarity decrease as being closer to the channel layer 114. In such case, the ionized carriers gather toward when the potential energy drops. This is mainly because the band gap of the back barrier layer 112 is higher than that of the channel layer 114, causing the band gap to lift-up.

In addition, because the polarization degree of the V-group element polarity and the III-group element polarity are different, the depths of their potential energy are also different. In the embodiments of FIG. 3, the depth of potential energy of the front barrier layer 116 with the III-group element polarity is greater than that of the back barrier layer 112 with the V-group element polarity. As a result, the potential energy of the first potential well is lower than that of the second potential well. In such case, the comparatively great amount of carriers may be confined in the conductive channel 1201 corresponding to the first potential well during the operation.

Compared with only one potential well at the interface of the front barrier layer 116 and the channel layer 114, another potential well (also called the second potential well here) provided by the present disclosure, which is formed at the interface of the back barrier layer 112 and the channel layer 114, may gather the remaining carriers in the channel layer 114 at the second potential well and reduce impact ionization, thereby improving the breakdown voltage and the reliability of the device.

In other words, the first conductive channel 1201 and the second conductive channel 1202 have different functions, respectively. The former enables the carrier to flow for conduction while the latter enables the carriers to gather without conduction.

In some embodiments, the front barrier layer 116 and the back barrier layer 112 may control the position of the conductive channel 120. Specifically, the front barrier layer 116 with the III-group element polarity (such as the gallium (Ga) polarity) may form the first conductive channel 1201 in the channel layer 114 close to the front barrier layer 116 while the back barrier layer 112 with the V-group element polarity (such as the nitrogen (N) polarity) form the second conductive channel 1202 in the channel layer 114 close to the back barrier layer 112.

The materials and the formation of the back barrier layer 112, the channel layer 114 and the front barrier layer 116 are described as follow.

In some embodiments, the back barrier layer 112 may be the III-V group compound including aluminum (Al), such as aluminium gallium nitride (AlGaN), aluminum nitride (AlN), aluminum indium nitride (AlInN), aluminum gallium indium nitride (AlGaInN), the combination thereof, or the like.

In some embodiments, the channel layer 114 may be the III-V group compound free of aluminum (Al), such as gallium nitride (GaN), indium gallium nitride (InGaN), the combination thereof, or the like. In some embodiments, the front barrier layer 116 may be the III-V group compound including aluminum (Al), which is similar to or same as the materials of the back barrier layer 112, and the details are not repeated here.

In some embodiments, the front barrier layer 116 and back barrier layer 112 are made of the same material, thereby ensuring the consistency of the epitaxy and the uniformity of the electrical properties.

Because the channel layer 114 is free of aluminum (Al) while the front barrier layer 116 and the back barrier layer 112 includes aluminum (Al), the band gap of the front barrier layer 116 and the back barrier layer 112 are higher than that of the channel layer 114. For example, the band gap of gallium nitride (GaN) is 3.4 eV, the band gap of aluminum nitride (AlN) is 6.2 eV, and the band gap of the aluminium gallium nitride (AlGaN) is therebetween depending on the mole fraction of aluminum (Al), such as 4.35 eV. By this configuration, the heterojunction is formed between the channel layer 114 and the front barrier layer 116 and between the channel layer 114 and the back barrier layer 112, thereby forming the first conductive channel 1201 and the second conductive channel 1202.

In some embodiments, the front barrier layer 116 and the back barrier layer 112 may include aluminum nitride (AlN). Because higher band gap may be provided by aluminum nitride (AlN), the deeper potential well may also be provided. In some embodiments, aluminum nitride (AlN) is used as the back barrier layer 112 to provide sufficient carriers from the channel layer to avoid formation of the surface channel.

In addition, the back barrier layer 112 with the higher band gap disposed between the buffer layer 110 and the channel layer 114 may change the profile of the potential energy under the channel layer 114 (see FIG. 3), such as pull-up of the potential energy, to confine the carriers in the channel layer 114.

It should be noted that the materials and the band gap shown here are merely taken as illustrative examples, and the skilled person in the art may apply other materials according to the principle.

In some embodiments, the thickness of the back barrier layer 112 is about 5-25 nm, the thickness of the channel layer 114 is about 200-500 nm, and the thickness of the front barrier layer 116 is about 5-25 nm.

In some embodiments, the back barrier layer 112 may or may not have dopants. In the case of having dopants, it is beneficial to the breakdown voltage of the semiconductor device. The dopants may be p-type dopants, such as carbon (C) or iron (Fe). The concentration of the dopants may be about $1\times10^{19}$ cm$^{-3}$-$5\times10^{20}$ cm$^{-3}$. In some embodiments, the channel layer 114 may be unintentionally doped (UID), and thus has ionized carriers therein. In some embodiments, the front barrier layer may be unintentionally doped (UID).

The epitaxial defects are formed during the epitaxial process, and thus the donor traps are formed to contribute n-type dopants. In this context, "unintentionally doped (UID)" refers to the dopants caused by the epitaxial defects. Generally, "unintentionally doped (UID)" is approximately equivalent to having a dopant concentration lower than about $5\times10^{19}$ cm$^{-3}$, such as $1\times10^{19}$ cm$^{-3}$.

In some embodiments, the back barrier layer 112 and the films underneath (such as the buffer layer) may both have dopants (such as carbon (C)). The concentration of the dopants may decrease as closer to the substrate, thereby preventing the leakage current path in the underlying layers from being formed.

In some embodiments, the formation of the front barrier layer 116, the channel layer 114, and the back barrier layer 112 may include molecular beam epitaxy (MBE), metal organic chemical vapor deposition (MOCVD), hydride vapor phase epitaxy (HVPE), other suitable methods, or the combination thereof.

Compared with the case where only the front barrier layer 116 is formed, the back barrier layer 112 provided by the present disclosure may pull up the potential energy between the channel layer and the films underneath. Thus, not only the ionized carriers in the channel layer 114 may be prevented from immigrating to the films underneath, but the surface polarization during the operation and thus electrical carriers trapped to form the surface channel may also be avoided. Therefore, the current collapse is avoided.

In other words, in the present disclosure, the back barrier layer 112 disposed below the channel layer 114 may reduce the surface polarization and improve the reduced surface field (RESURF), thereby inhibiting the current collapse and improving the breakdown voltage.

In addition, the back barrier layer 112 disposed on the substrate including the blocking layers and the ceramic base substrate may reduce warpage, thereby improving the performance of the device.

Figure 4:
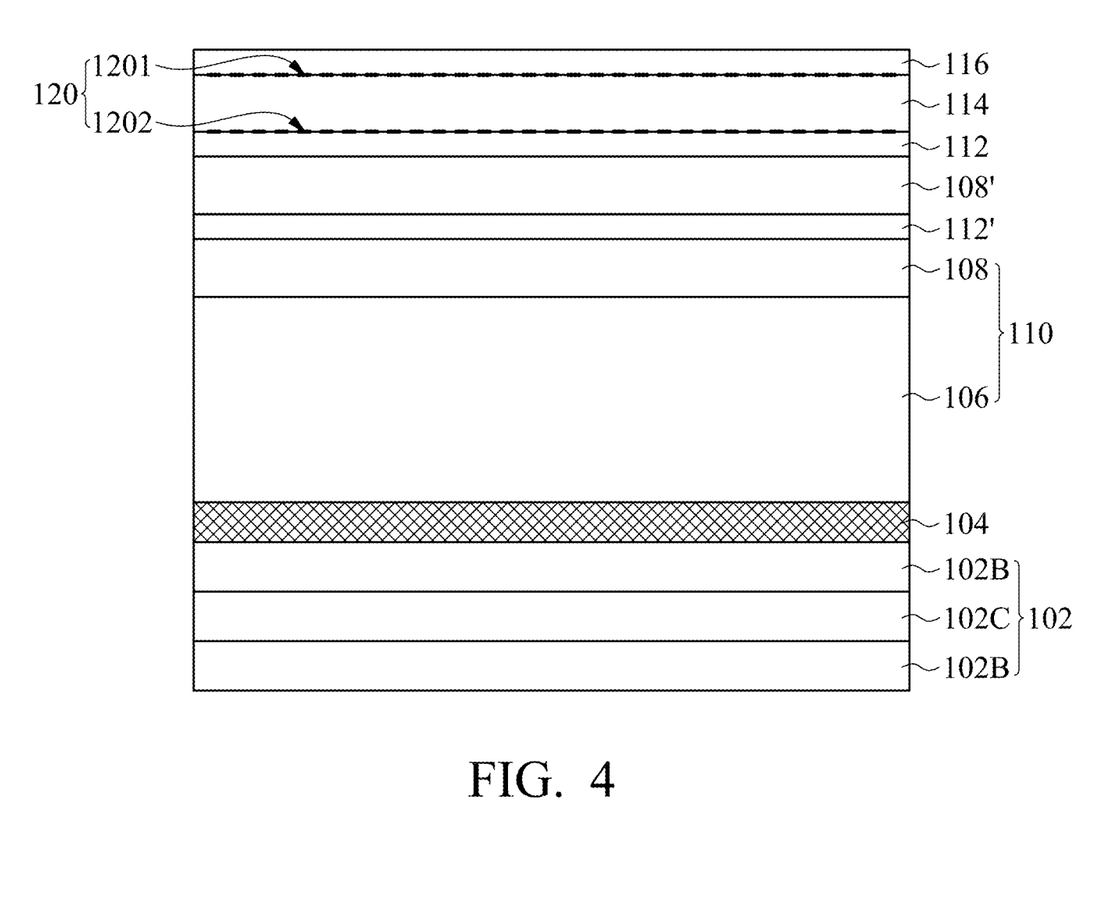
FIGS. 4-5 are cross-sectional views illustrating an exemplary semiconductor structure according to other embodiments of the present disclosure.

FIG. 4 is a cross-sectional view illustrating an exemplary semiconductor structure according to other embodiments of the present disclosure. The difference between FIG. 4 and FIG. 1 is that another back barrier layer 112 and another resistive layer 108 is disposed on the buffer layer 108. Specifically, the resistive layer 108 and the back barrier layer 112 are stacked alternately on the superlattice layer 106. In this embodiment, the leakage current may be further prevented, thereby improving breakdown voltage.

In addition, the two back barrier layers 112 may use the same or similar materials, and the two resistive layers 108 may also use the same or similar materials and have the same or similar dopants. The dopants may be p-type, such as carbon (C) or iron (Fe), to improve resistance, thereby inhibiting the leakage current.

In the embodiment of FIG. 4, the back barrier layer 112 with the higher band gap is inserted between the two resistive layers 108. As a result, not only carriers are prevented from leaking toward the substrate, but also the strain may be adjusted advantageously, inhibiting the warpage of the substrate.

Figure 5:
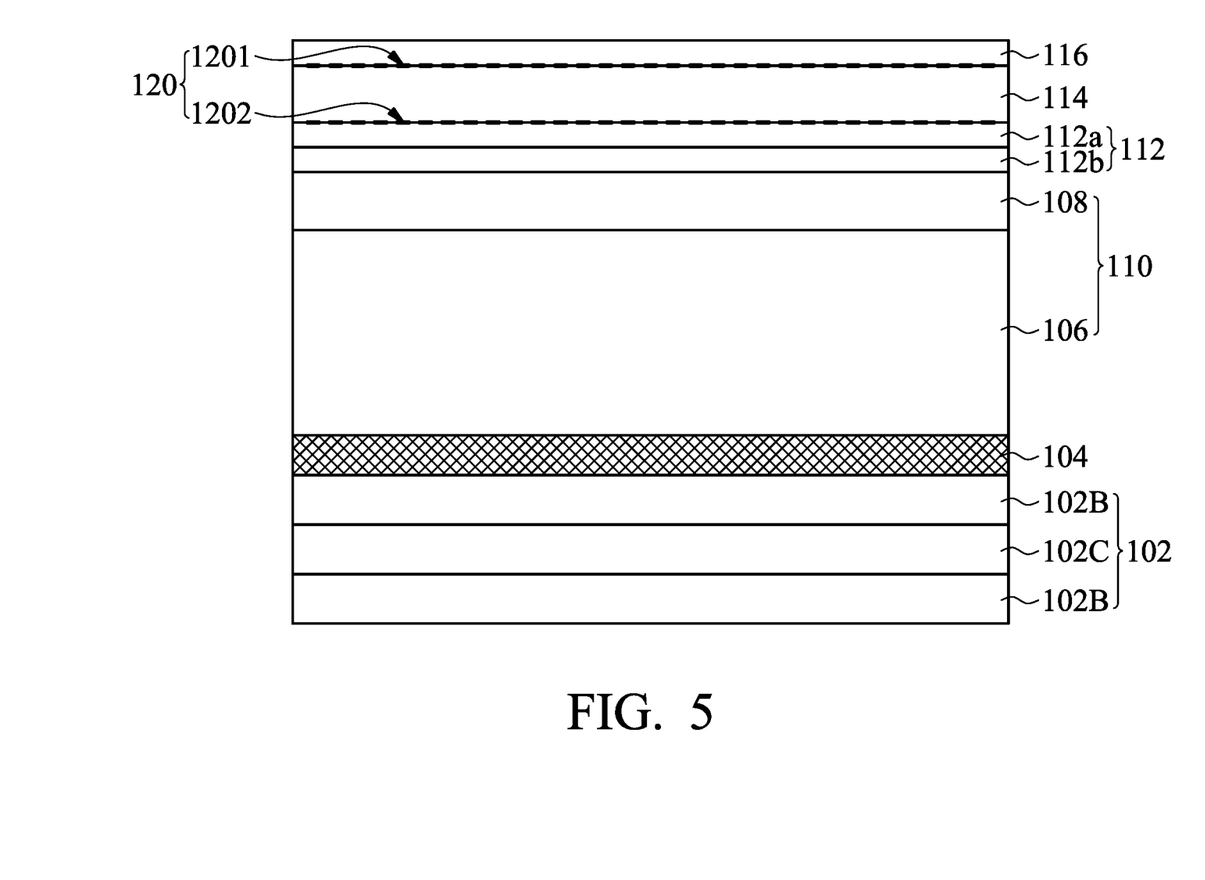

FIG. 5 is a cross-sectional view illustrating an exemplary semiconductor structure according to other embodiments of the present disclosure. The difference between FIG. 5 and FIG. 1 is that the back barrier layer 112 is a composite layer including a first back barrier layer 112a and a second back barrier layer 112b. Specifically, the first back barrier layer 112a is adjacent to the channel layer 114 while the second back barrier layer 112b is away from the channel layer 114. The first back barrier layer 112a and the second back barrier layer 112b are any two of III-V group compound including aluminum (Al), respectively. For example, the first back barrier layer 112a may be aluminum nitride (AlN) while the second back barrier layer 112b may be aluminium gallium nitride (AlGaN). By forming the composite layer serving as the back barrier layer 112, parasitic two dimensional hole gas (2DHG) is prevented from forming between the back barrier layer 112 and the films underneath, and thus improving the performance of the semiconductor device. Furthermore, warpage of the substrate 102 is also prevented.

In some embodiments, the band gap of the first back barrier layer 112a is higher than that of the second back barrier layer 112b. By disposing the first back barrier layer 112a with the higher band gap, carriers in the channel layer 114 are prevented from immigrating to the films below the channel layer 114 (such as the back barrier layer 112 or the buffer layer 110). Also, by disposing the second back barrier layer 112b with the lower band gap, the band gap difference of the second back barrier layer 112b and the underlying layers (such as the buffer layer 110) is reduced, thereby inhibiting parasitic two dimensional hole gas (2DHG).

Figure 6:
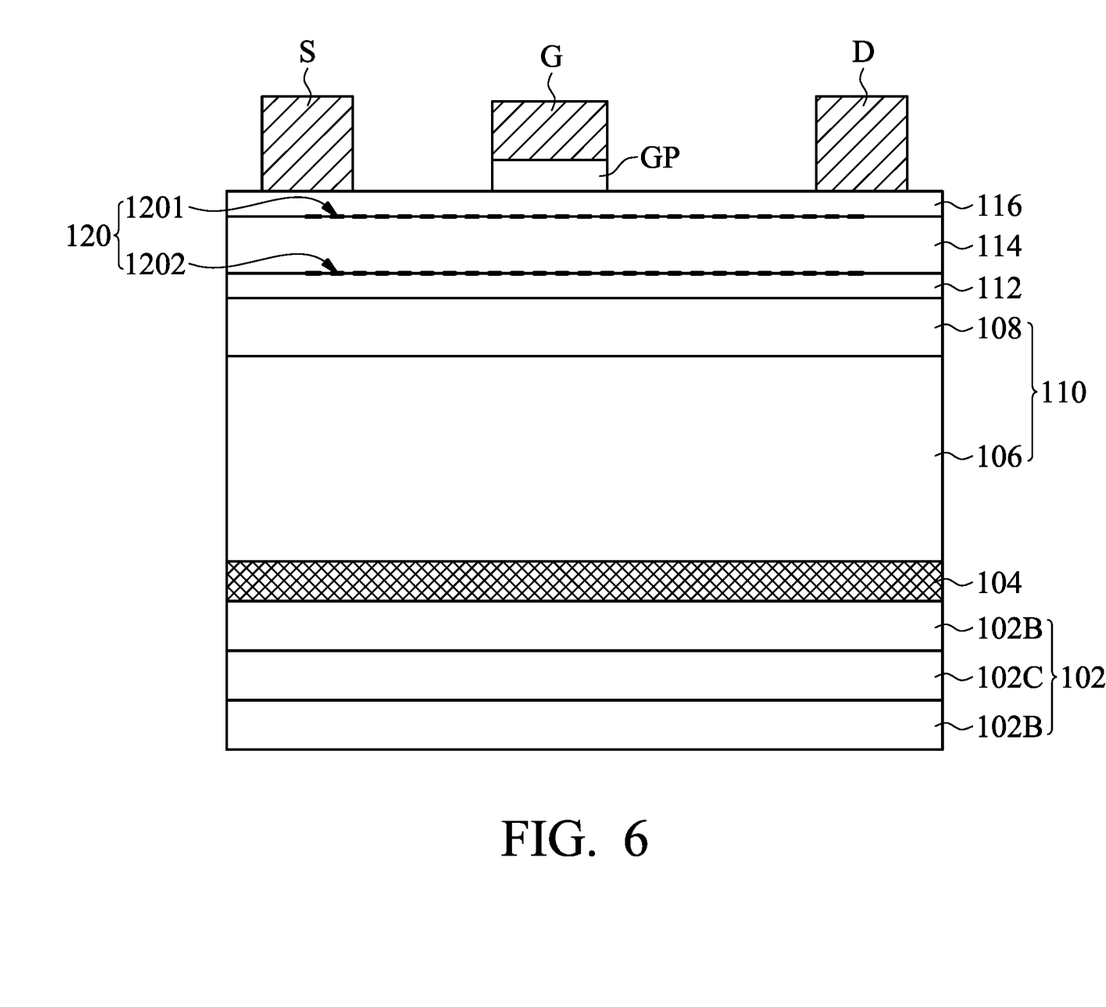
FIGS. 6-9 are cross-sectional views illustrating an exemplary semiconductor device according to other embodiments of the present disclosure.

FIG. 6 is a cross-sectional view illustrating an exemplary semiconductor device according to other embodiments of the present disclosure. In some embodiments, the semiconductor device is a high electron mobility transistor (HEMT). The difference between FIG. 6 and FIG. 1 is that a gate electrode G, a source electrode S and a drain electrode D are further formed on the front barrier layer 116, wherein the source electrode S and the drain electrode D are positioned on opposite sides of the gate electrode G, respectively. In addition, a doped compound semiconductor layer GP is disposed under the gate electrode G.

In some embodiments, the materials of the gate electrode G may be conductive materials, such as metal, metal nitride, or semiconductor materials. In some embodiments, the metal may be Au, Ni, Pt, Pd, Ir, Ti, Cr, W, Al, Cu, the like, the combination thereof, or multilayers thereof. The semiconductor materials may be polycrystalline silicon or polycrystalline germanium. The conductive material may be formed on the front barrier layer 116 by chemical vapor deposition (CVD), atomic layer deposition (ALD), physical vapor deposition (PVD) (such as sputtering), resistive thermal evaporation process, electron beam evaporation process, or other suitable deposition processes, and then a patterning process is performed on the conductive material to form the gate electrode G.

In some embodiments, before the formation of the gate electrode G, the doped compound semiconductor layer GP may be formed on the front barrier layer 116, and the gate electrode G is subsequently formed on the doped compound semiconductor layer GP. The generation of 2DEG under the gate electrode G may be inhibited by the doped compound semiconductor layer GP between the gate electrode G and the front barrier layer 116 so as to attain a normally-off status of the semiconductor device.

In some embodiments, the materials of the doped compound semiconductor layer GP may be III-V group compound doped with p-type or n-type dopants, such as gallium nitride (GaN). In some embodiments, p-type dopants may include magnesium (Mg), carbon (C), and the like. The concentration of the dopants may be about $1 \times 10^{17}$ cm$^{-3}$-$1 \times 10^{21}$ cm$^{-3}$.

In some embodiments, the thickness of the doped compound semiconductor layer GP may be 50-200 nm.

The steps of forming the doped compound semiconductor layer GP may include depositing a doped compound semiconductor layer (not shown) on the front barrier layer 116 by using an epitaxial growth process, and performing a patterning process on the doped compound semiconductor layer to form the doped compound semiconductor layer GP corresponding to the predetermined position where the gate electrode G is to be formed.

In some embodiments, the gate electrode G connects the doped compound semiconductor layer GP. Schottky contact is formed between the gate electrode G and the doped compound semiconductor layer GP.

In some embodiments, the source electrode S and the drain electrode D, which are respectively formed on opposite sides of the gate electrode G, may be substantially the same as or similar to the deposition process and the materials of the gate electrode G and thus the details are not repeated again here.

Figure 7:
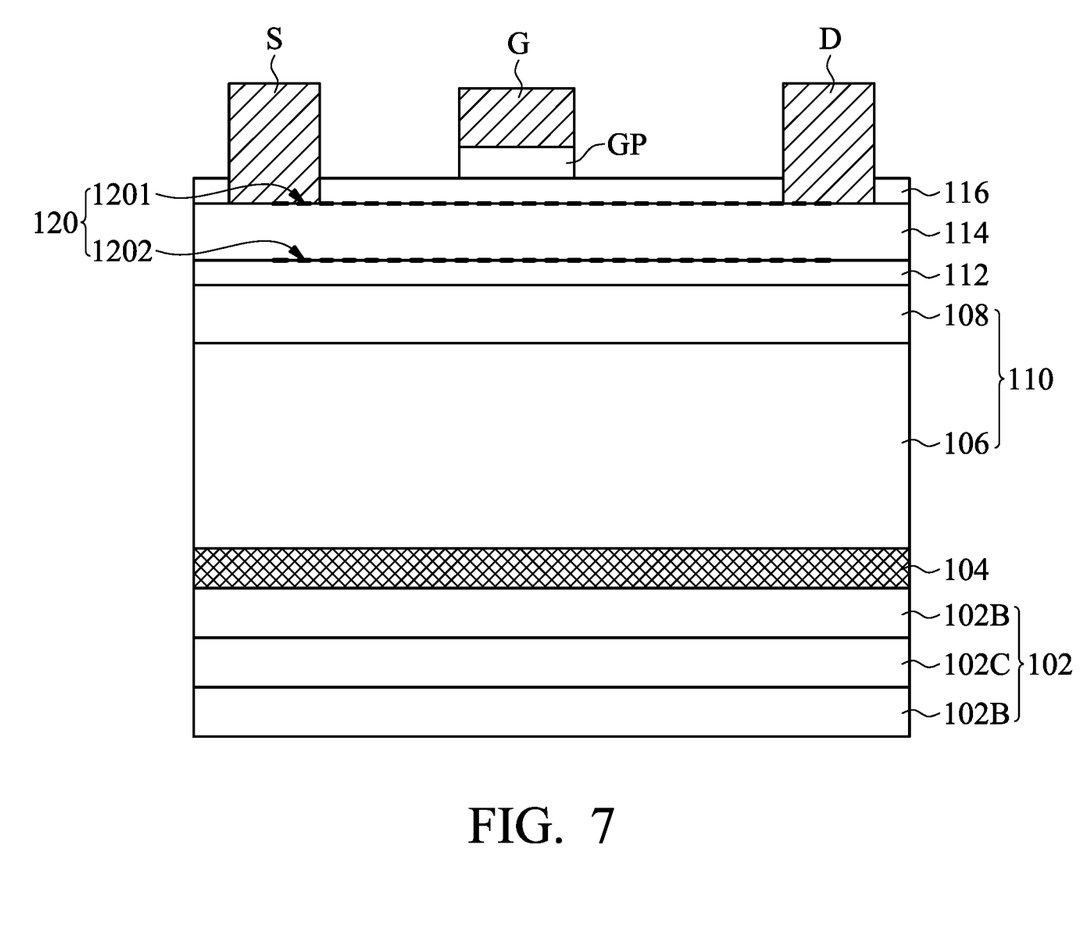

FIG. 7 is a cross-sectional view illustrating an exemplary semiconductor device according to other embodiments of the present disclosure. The difference between FIG. 7 and FIG. 6 is that the source electrode S and the drain electrode D penetrate through the front barrier layer 116 and contact the channel layer 114. Specifically, the bottom surface of the source electrode S and that of the drain electrode D are level with the top surface of the channel layer 114. In such case, the contact area is increased and the contact resistance is reduced.

Figure 8:
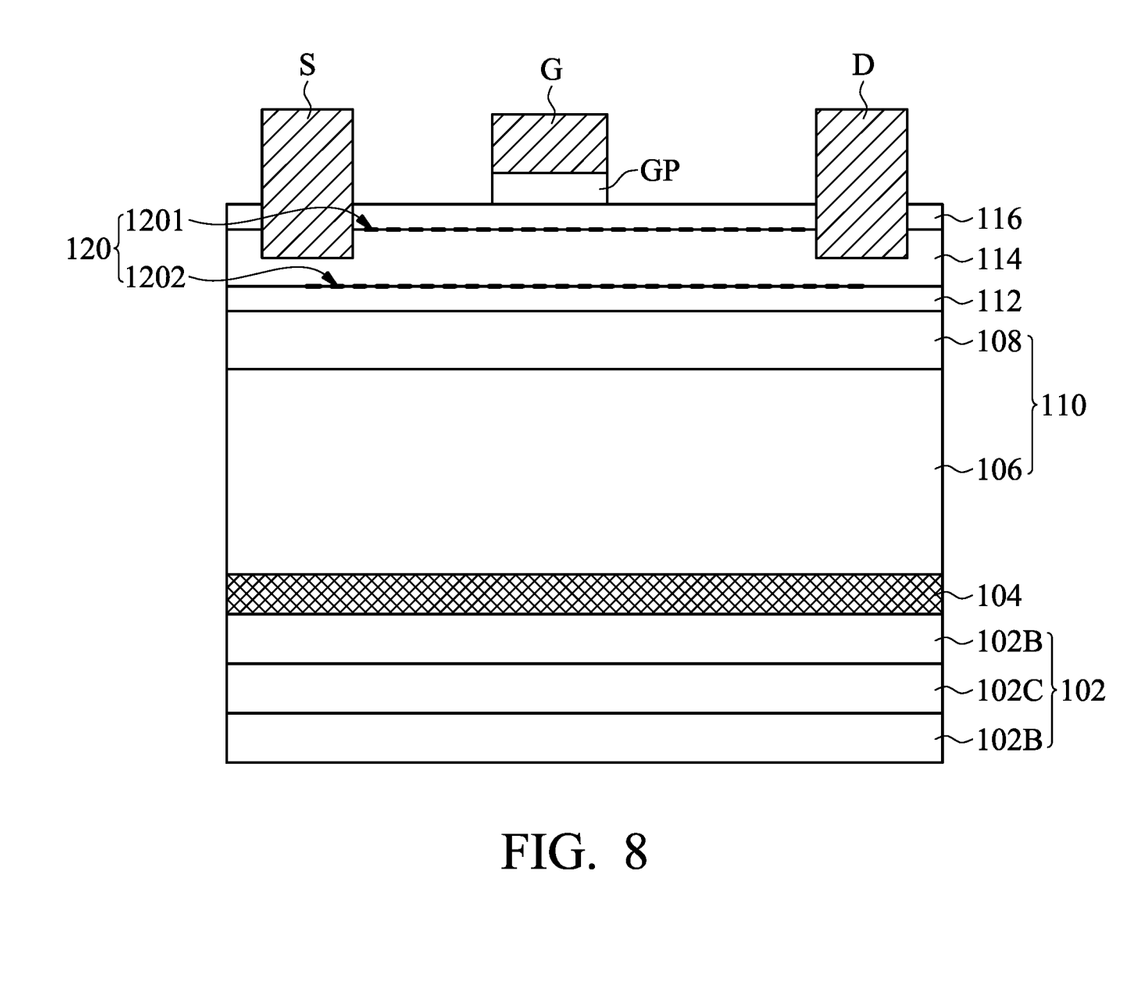

FIG. 8 is a cross-sectional view illustrating an exemplary semiconductor device according to other embodiments of the present disclosure. The difference between FIG. 8 and FIG. 7 is that the source electrode S and the drain electrode D further penetrate through the partial channel layer 114 without contacting the back barrier layer 112. Specifically, the source electrode S and the drain electrode D only penetrate the first conductive channel 1201 but do not contact the second conductive channel 1202 to prevent the carriers in the second conductive channel 1202 from flowing and thus avoid the leakage current.

Figure 9:
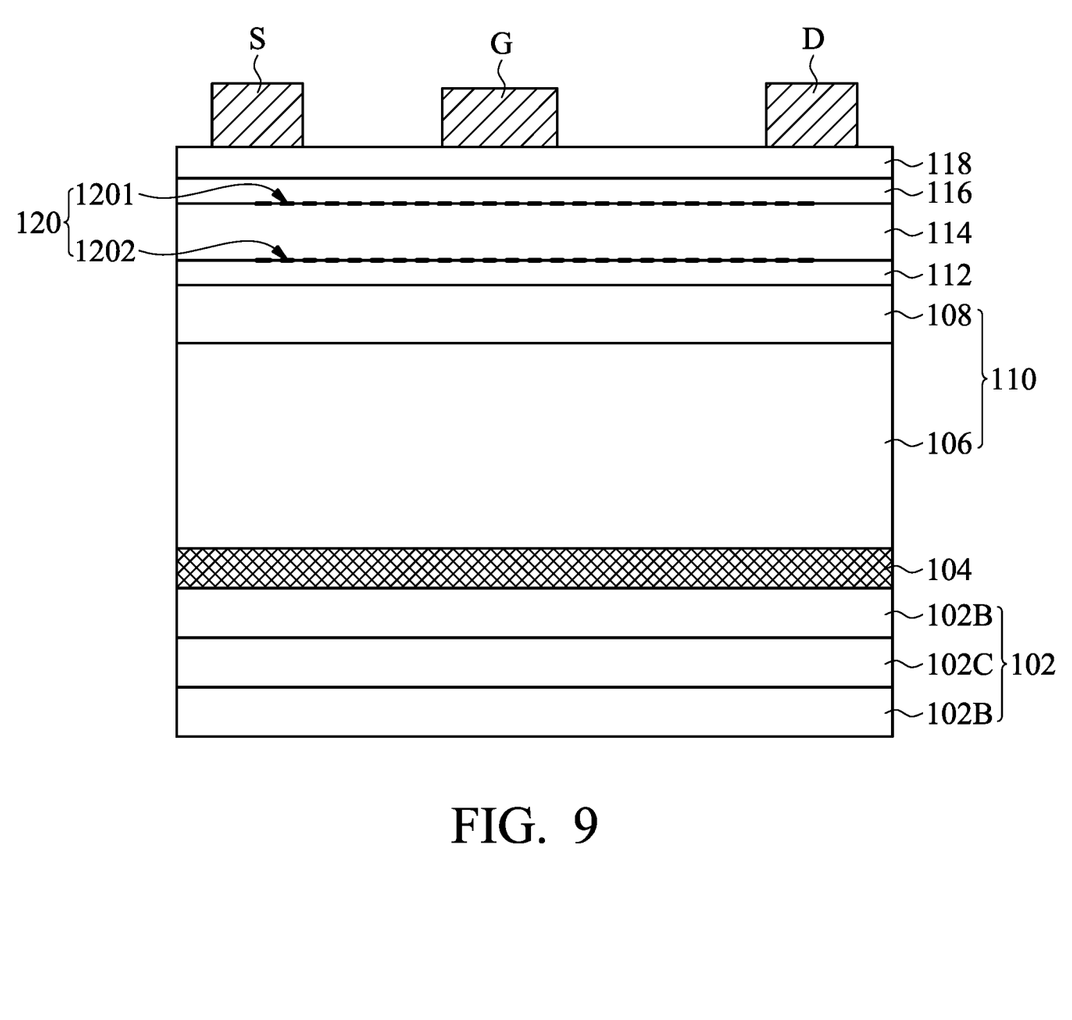

FIG. 9 is a cross-sectional view illustrating an exemplary semiconductor device according to other embodiments of the present disclosure. The difference between FIG. 9 and FIG. 7 is that a cap layer 118 substitutes the doped compound semiconductor layer GP and extends beneath the source electrode S and the drain electrode D. Specifically, the cap layer 118 may be the III-V group compound, such as gallium nitride (GaN). In some embodiments, the cap layer is unintentionally doped.

Generally, high temperature environments and plasma source with high energy are required for the process of forming the electrodes, such as the gate electrode G, the source electrode S, and the drain electrode D. However, in the high temperature and the high energy circumstance, the surface of the underlying layers (such as the front barrier layer 116) is broken easily, and many charged traps are formed accordingly, and thus the performance of the manufactured semiconductor device is affected. Therefore, the cap layer 118 may protect underlying layers from damage.

In some embodiments, the cap layer 118 and the doped compound semiconductor layer GP may exist at the same time (not shown) in order to protect the semiconductor device and attain a normally-off status of the semiconductor device at the same time.

In summary, the back barrier layer and the front barrier layer provided by the present disclosure are on opposite sides of the channel layer, respectively and the two conductive channels are thus formed in the channel layer. In such case, the surface electrical field caused by the surface polarization effect may be reduced, and the underlying layers (such as resistive layer) may be prevented from trapping electrical carriers, thereby improving the collapse current. In addition, the back barrier layer and the front barrier layer with different types of the polarity may confine the carriers in the channel layer. Furthermore, the back barrier layer with the dopants may prevent current from leaking to the underlying layers, thereby improving the breakdown voltage. The back barrier layer disposed on the substrate may adjust the curvature of the substrate and reduce the dynamic on-resistance, wherein the substrate includes a pair of the blocking layers and the ceramic base substrate sandwiched therebetween. In other words, the features above provided by the present disclosure may improve the operational stability and the reliability of the semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a substrate;
a seed layer on the substrate;
a buffer layer on the seed layer;
a back barrier layer on the buffer layer, wherein a top surface of the back barrier layer has a V-group element polarity, wherein the buffer layer comprises a resistive layer disposed under the back barrier layer;
another back barrier layer on the resistive layer and another resistive layer on the another back barrier layer, wherein each of the back barrier layer, the another back barrier layer, the resistive layer, and the another resistive layer comprises aluminum (Al), gallium (Ga), and nitrogen (N), wherein the another back barrier layer has higher aluminum fraction than the another resistive layer, wherein the another back barrier layer has lower gallium fraction than the another resistive layer, and wherein each of the resistive layer, the another resistive layer, the back barrier layer, and the another back barrier layer has a carbon (C) dopant;
a channel layer directly on the back barrier layer; and
a front barrier layer on the channel layer, wherein the front barrier layer has a top surface having a III-group element polarity.

2. The semiconductor structure as claimed in claim 1, wherein the back barrier layer comprises AlGaN, AlGaInN, or a combination thereof.

3. The semiconductor structure as claimed in claim 1, wherein the back barrier layer is AlGaN with a nitrogen (N) polarity.

4. The semiconductor structure as claimed in claim 1, wherein a band gap of the back barrier layer is higher than a band gap of the resistive layer.

5. The semiconductor structure as claimed in claim 1, wherein the front barrier layer is AlGaN with a gallium (Ga) polarity.

6. The semiconductor structure as claimed in claim 1, wherein band gaps of the front barrier layer and the back barrier layer are higher than a band gap of the channel layer.

7. The semiconductor structure as claimed in claim 1, wherein the channel layer is an unintentionally doped III-V group compound and is free of aluminum (Al).

8. The semiconductor structure as claimed in claim 1, wherein the substrate comprises a ceramic base substrate and a pair of blocking layers sandwiching the ceramic base substrate.

9. The semiconductor structure as claimed in claim 1, wherein a thickness of the front barrier and the back barrier layer are about 5-25 nm.

10. The semiconductor structure as claimed in claim 1, wherein the back barrier layer with a nitrogen (N) polarity which is grown along a direction and the front barrier layer with a gallium (Ga) polarity which is grown along a direction.

11. The semiconductor structure as claimed in claim 10, further comprising a first conductive channel and a second conductive channel located at an interface of the channel layer and the front barrier layer and an interface of the channel layer and the another back barrier layer, respectively,
wherein the first conductive channel and the second conductive channel have a first potential well and a second potential well, respectively,
wherein a minimum of a first potential energy of the first potential well is lower than a minimum of a second potential energy of the second potential well.

12. A semiconductor device, comprising:
a semiconductor structure as claimed in claim 1;
a gate electrode on the semiconductor structure; and
a source electrode and a drain electrode on opposite sides of the gate electrode.

* * * * *